United States Patent
Hopper et al.

(10) Patent No.: US 6,798,641 B1
(45) Date of Patent: Sep. 28, 2004

(54) LOW COST, HIGH DENSITY DIFFUSION DIODE-CAPACITOR

(75) Inventors: Peter J. Hopper, San Jose, CA (US); Philipp Lindorfer, San Jose, CA (US); Vladislav Vashchenko, Palo Alto, CA (US); Andrew Strachan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/647,602

(22) Filed: Aug. 25, 2003

(51) Int. Cl.[7] ............................................... H01G 4/228
(52) U.S. Cl. ................. 361/306.1; 361/306.3; 361/321.1; 361/321.4; 361/311; 361/313; 361/303
(58) Field of Search .................... 361/306.1, 306.3, 361/321.1, 321.4, 303, 305, 311, 313, 301.2; 438/253, 254, 397, 398; 257/306, 355, 359, 362

(56) References Cited

U.S. PATENT DOCUMENTS 5,355,014 A * 10/1994 Rao et al. .................... 257/533
6,190,964 B1 * 2/2001 Winters ....................... 438/254

* cited by examiner

*Primary Examiner*—Dean A. Reichard
*Assistant Examiner*—Nguyen T. Ha
(74) *Attorney, Agent, or Firm*—Stallman & Pollock LLP

(57) ABSTRACT

A multiple-layer diffusion junction capacitor structure includes multiple layers of inter-digitated P-type dopant and N-type dopant formed in a semiconductor substrate. An opening in a hard mask is formed taking care to control the angle of the sidewall using a dry, anisotropic etching process. P-type and N-type dopant are then implanted at positive and negative shallow angles, respectively, each with a different energy and dose. By utilizing the properly determined implant angles, implant energies and implant doses for each of the dopant types, a high capacitance and high density diode junction capacitor, with inter-digitated N-type and P-type regions in the vertical direction is provided.

6 Claims, 1 Drawing Sheet

LOW COST, HIGH DENSITY DIFFUSION DIODE-CAPACITOR

TECHNICAL FIELD

The present invention is directed to a high density junction capacitor structure that is formed utilizing a single mask and a series of angled ion implants resulting in an inter-digitated capacitor with superior diode breakdown, forward resistance and capacitance density characteristics.

BACKGROUND OF THE INVENTION

PN junctions are commonly used in semiconductor integrated circuits as diode-capacitor elements. The depletion layer of a PN junction is the interface of the junction and, as the name implies, is depleted of charge carriers. Under certain bias conditions, the depletion layer of a PN junction is capable of storing charge carriers. The capacitance of the depletion layer is proportional to its area. That is, for a given set of bias conditions, the greater the area occupied by the PN junction, the greater the capacitance. Of course, may integrated circuit applications require that the die size of the circuit be as small as possible. Therefore, it would be highly desirable to have available a PN junction capacitor structure that provides increased capacitance while utilizing smaller area.

A capacitor with an increased capacitance per unit area and for a given voltage range of operation is thus a valuable device. Capacitors with higher levels of doping offer a higher per unit area capacitance, but trade off breakdown voltage. Thus, a valuable device would offer both a high per unit area capacitance and a high breakdown voltage. A capacitor with a high breakdown voltage and a high per unit area capacitance is currently not readily available as a single PN junction.

DESCRIPTION OF THE INVENTION

The present invention provides a stack of interdigitated capacitors that are linked together by utilizing a tilted implant, thereby providing a capacitor structure with both a high capacitance per unit area and a high breakdown voltage, utilizing only a single mask.

Figure 1:
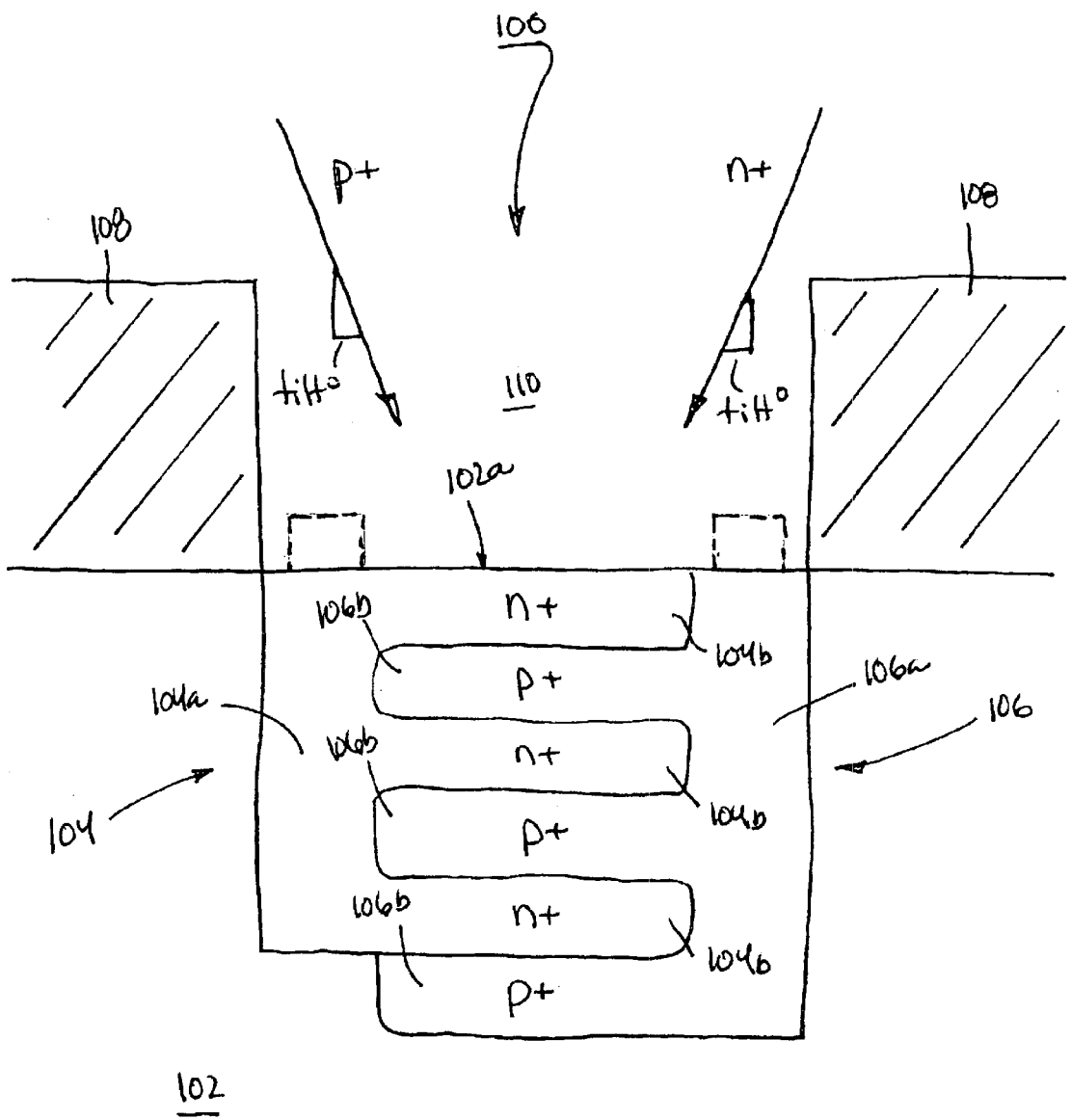
FIG. 1 is a partial cross-section drawing illustrating a multi-layer diffusion junction capacitor structure in accordance with the concepts of the present invention.
Figure 1:
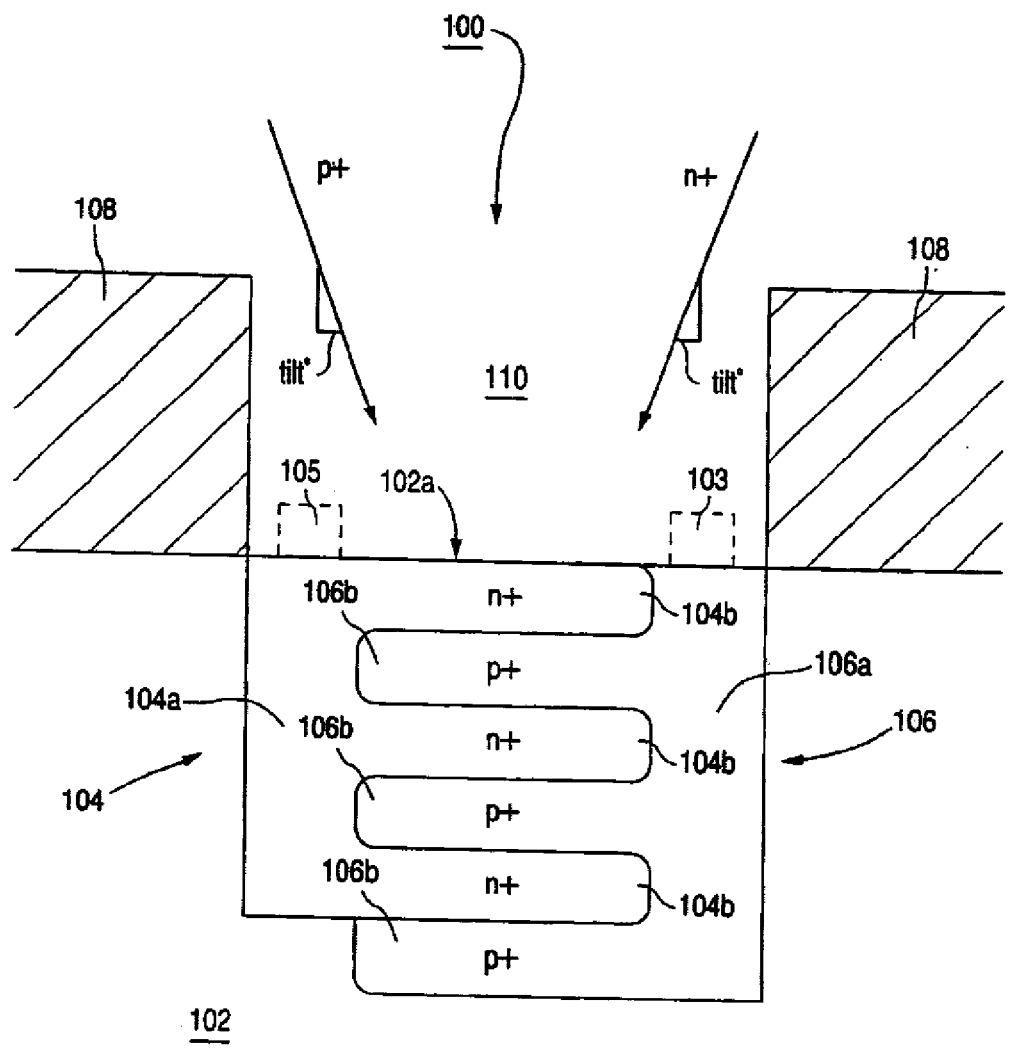

FIG. 1 shows a multi-layer diffusion junction capacitor structure 100 formed in a semiconductor substrate 102. Typically, the semiconductor substrate 102 will be crystalline silicon, although other semiconductor materials (e.g. SiGe, Ge) can also be used. The capacitor structure 100 includes an N-type region 104 formed in the semiconductor substrate 102 and including a N-type vertical portion 104a and a plurality of spaced-apart N-type fingers 104b that extend from the N-type vertical portion 104a. The capacitor structure 100 also includes a P-type region 106 that includes a P-type vertical portion 106a and a plurality of spaced-apart P-type fingers 106b that extend from the P-type vertical portion 106a. As illustrated in FIG. 1, the combination of the N-type region 104 and the P-type region 106 results in a structure wherein the N-type fingers 104b and the P-type fingers 106b are inter-digitated.

The diode capacitor structure 100 shown in FIG. 1 can be formed in accordance with the following sequence of conventional semiconductor integrated circuit fabrication steps.

First, a patterned hard mask 108 is formed on an upper surface of the semiconductor substrate 102. The hard mask 108 may be formed using, for example, oxide, nitride or photoresist. At least one opening 110 is formed in the hard mask 108 to expose an upper surface area 102a of the semiconductor substrate 102. Care is taken to control the angle of the sidewalls of the opening 110 in the hard mask 108 with the use of a dry, anisotropic etching process so that the sidewall is substantially vertical.

Next, a sequence of implant steps is performed wherein P-type (p+) and N-type (n+) dopant are alternatingly implanted at positive and negative implant angles, respectively. For a particular conductivity type dopant, each implant in the sequence is performed with a different energy and implant dose, thereby resulting in the inter-digitated structure 100 shown in FIG. 1.

For example, in an embodiment of the invention, an oxide mask is formed on the upper surface of a silicon substrate. An opening is then formed in the oxide mask to expose an upper surface area of the silicon. Next, a phosphorous implant at a dose of 1 E13/cm$^3$ and at an implant energy of 15 KeV and at a tilt angle of −2 degrees is performed. This is followed by an implant of boron dopant at a dose of 8E11/cm$^3$ and an implant energy of 20 KeV and a tilt angle of 2 degrees. A second phosphorous implant is then performed at a dose of 5E11/cm$^3$, an implant energy of 200 KeV and a tilt angle of −1 degree. A second boron implant is then performed at a dose of 3E11/cm$^3$, an energy of 180 KeV and a tilt angle of 2 degrees. A third phosphorous implant is then performed at dose of 5E11/cm$^3$, an implant energy of 600 KeV and a tilt angle of −2 degrees. A third boron implant is then performed at a dose of 6E11/cm$^3$, an implant energy of 600 KeV and a tilt angle of 2 degrees. The preceding sequence of alternating phosphorous and boron implants results in a three layer inter-digitated diffusion diode/capacitor structure in accordance with the concepts of the present invention (see FIG. 1).

Following the formation of the inter-digitated capacitor structure, a layer of aluminum or other conductive interconnect material is deposited over the capacitor structure and etched to provide a first conductive electrode 103 to the N-type dopant region 104 and a second conductive electrode 105 to the P-type dopant region 106. The first conductive electrode 103 and the second conductive electrode 105 are shown in dashed lines in FIG. 1.

Although only specific embodiments of the present invention are shown and described herein, the invention is not to be limited by these embodiments. Rather, the scope of the invention is to be defined by these descriptions taken together with the attached claims and their equivalents.

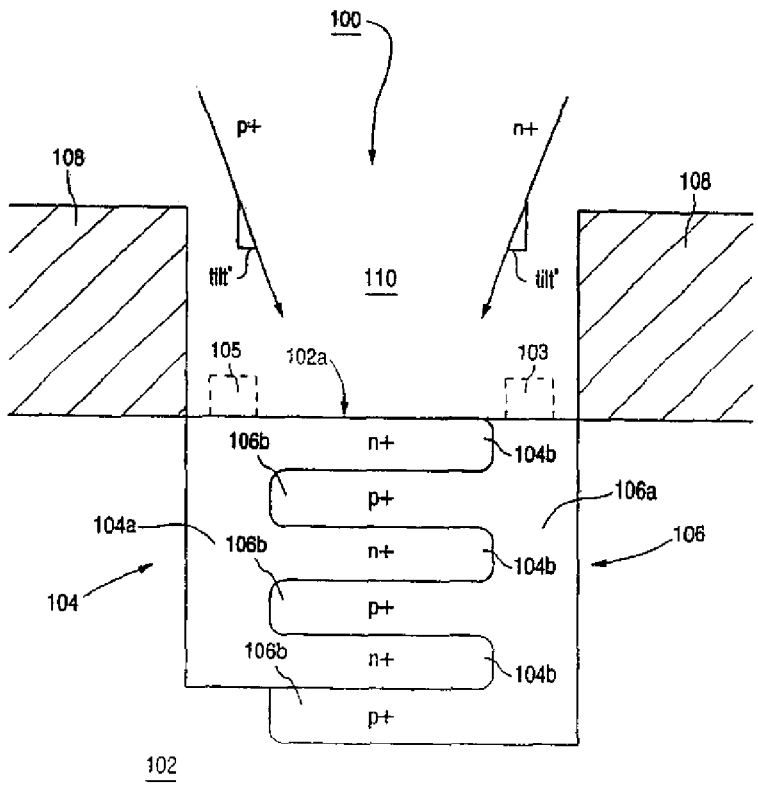

What is claimed is:

1. A multiple-layer diffusion junction capacitor structure comprising:
    an N-type region formed in a semiconductor substrate and having an N-type vertical portion and a plurality of spaced-apart N-type fingers that extend from the N-type vertical portion; and
    a P-type region formed in a semiconductor substrate and having a P-type vertical portion and a plurality of spaced-apart P-type fingers that extend from the P-type vertical portion, and
    wherein the N-type fingers and the P-type fingers are inter-digitated and in direct contact.

2. A multiple-layer diffusion junction capacitor structure as in claim 1, and further comprising:
    a first conductive electrode formed on an upper surface of the N-type region; and a second conductive electrode formed on an upper surface of the P-type region.

3. A multiple-layer diffusion junction capacitor structure as in claim 2, and wherein both the first conductive electrode and the second conductive electrode comprise aluminum.

4. A method of forming an N-layer junction capacitor structure in a semiconductor substrate, wherein N is an integer, the method comprising:

forming a patterned mask on an upper surface of the semiconductor substrate, the patterned mask having at least one opening formed therein to expose an upper surface area of the semiconductor substrate;

forming a sequence of N alternating implants of P-type dopant and of N-type dopant at negative and positive implant angles, respectively, for a particular conductivity type dopant each implant being performed with a different energy and implant dose, thereby resulting in N inter-digitated layers of P-type dopant and N-type dopant formed in a semiconductor substrate; and forming a first conductive electrode in electrical contact with the P-type dopant layers and a second conductive electrode in electrical contact with the N-type dopant layers.

5. A method as in claim 4, and wherein the patterned mask comprises silicon oxide.

6. A method as in claim 4, and wherein the first and second conductive electrodes comprise aluminum.

* * * * *

UNITED STATES PATENT AND TRADEMARK OFFICE
CERTIFICATE OF CORRECTION

PATENT NO. : 6,798,641 B1
DATED : September 28, 2004
INVENTOR(S) : Peter J. Hopper et al.

It is certified that error appears in the above-identified patent and that said Letters Patent is hereby corrected as shown below:

Title page illustrating a figure should be deleted, and substituted therefor title page illustrating a figure. (Attached)

Delete Fig 1, and substitute therefor Fig 1. (Attached)

Signed and Sealed this

Fifth Day of April, 2005

JON W. DUDAS
*Director of the United States Patent and Trademark Office*

United States Patent
Hopper et al.

(10) Patent No.: US 6,798,641 B1
(45) Date of Patent: Sep. 28, 2004

(54) LOW COST, HIGH DENSITY DIFFUSION DIODE-CAPACITOR

(75) Inventors: Peter J. Hopper, San Jose, CA (US); Philipp Lindorfer, San Jose, CA (US); Vladislav Vashchenko, Palo Alto, CA (US); Andrew Strachan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/647,602

(22) Filed: Aug. 25, 2003

(51) Int. Cl.$^7$ ............................................. H01G 4/228
(52) U.S. Cl. ..................... 361/306.1; 361/306.3; 361/321.1; 361/321.4; 361/311; 361/313; 361/303
(58) Field of Search ................... 361/306.1, 306.3, 361/321.1, 321.4, 303, 305, 311, 313, 301.2; 438/253, 254, 397, 398; 257/306, 355, 359, 362

(56) References Cited

U.S. PATENT DOCUMENTS 5,355,014 A * 10/1994 Rao et al. .................. 257/533
6,190,964 B1 * 2/2001 Winters ..................... 438/254

* cited by examiner

Primary Examiner—Dean A. Reichard
Assistant Examiner—Nguyen T. Ha
(74) Attorney, Agent, or Firm—Stallman & Pollock LLP

(57) ABSTRACT

A multiple-layer diffusion junction capacitor structure includes multiple layers of inter-digitated P-type dopant and N-type dopant formed in a semiconductor substrate. An opening in a hard mask is formed taking care to control the angle of the sidewall using a dry, anisotropic etching process. P-type and N-type dopant are then implanted at positive and negative shallow angles, respectively, each with a different energy and dose. By utilizing the properly determined implant angles, implant energies and implant doses for each of the dopant types, a high capacitance and high density diode junction capacitor, with inter-digitated N-type and P-type regions in the vertical direction is provided.

6 Claims, 1 Drawing Sheet